(12) United States Patent
Tseng et al.

(10) Patent No.: US 10,312,250 B1
(45) Date of Patent: Jun. 4, 2019

(54) SEMICONDUCTOR DEVICE AND MANUFACTURING METHOD THEREOF

(71) Applicant: United Microelectronics Corp., Hsinchu (TW)

(72) Inventors: Hsuan-Chun Tseng, Taipei (TW); Hsueh-Chun Hsiao, Hsinchu County (TW); Tzu-Yun Chang, Hsinchu County (TW); Chi-Cheng Huang, Kaohsiung (TW); Ping-Chia Shih, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/878,278

(22) Filed: Jan. 23, 2018

(30) Foreign Application Priority Data

Dec. 28, 2017 (CN) .......................... 2017 1 1460739

(51) Int. Cl.
*H01L 29/78* (2006.01)
*H01L 21/265* (2006.01)
*H01L 21/266* (2006.01)
*H01L 21/311* (2006.01)
*H01L 27/1157* (2017.01)
*H01L 27/11524* (2017.01)
*H01L 27/11534* (2017.01)
*H01L 27/11573* (2017.01)
*H01L 27/11578* (2017.01)

(52) U.S. Cl.
CPC ...... *H01L 27/11534* (2013.01); *H01L 21/266* (2013.01); *H01L 21/2652* (2013.01); *H01L 21/31111* (2013.01); *H01L 27/1157* (2013.01); *H01L 27/11524* (2013.01); *H01L 27/11573* (2013.01); *H01L 27/11578* (2013.01); *H01L 29/785* (2013.01)

(58) Field of Classification Search
None
See application file for complete search history.

(56) References Cited

U.S. PATENT DOCUMENTS 9,659,948 B2  5/2017 Hsu et al.
2018/0247952 A1* 8/2018 Tsuda ................ H01L 29/66833

OTHER PUBLICATIONS

Jin-Woo Flan et al.,"A Unified-RAM (URAM) Cell for Multi-Functioning Capacitorless DRAM and NVM",2007 IEEE International Electron Devices Meeting,Dec. 10-12, 2007,pp. 929-932.

* cited by examiner

*Primary Examiner* — Whitney Moore
(74) *Attorney, Agent, or Firm* — J.C. Patents (57) ABSTRACT

A semiconductor device and a manufacturing method thereof are provided. The semiconductor device includes a substrate, a plurality of isolation structures, a charge storage layer, and a conductive layer. The substrate has a memory region and a logic region. The substrate in the memory region has a plurality of semiconductor fins. The isolation structures are disposed in the substrate to isolate the semiconductor fins. The semiconductor fins are protruded beyond the isolation structures. The charge storage layer covers the semiconductor fins. The conductive layer is disposed across the semiconductor fins and the isolation structures such that the charge storage layer is disposed between the conductive layer and the semiconductor fins.

14 Claims, 10 Drawing Sheets

SEMICONDUCTOR DEVICE AND MANUFACTURING METHOD THEREOF

CROSS-REFERENCE TO RELATED APPLICATION

This application claims the priority benefit of China application serial no. 201711460739.0, filed on Dec. 28, 2017. The entirety of the above-mentioned patent application is hereby incorporated by reference herein and made a part of this specification.

BACKGROUND OF THE INVENTION

Field of the Invention

The invention relates to an integrated circuit and a manufacturing method thereof, and more particularly, to a semiconductor device and a manufacturing method thereof.

Description of Related Art

The memory is a semiconductor device for storing information or data in a computer or an electronic product and is divided into volatile memory and non-volatile memory. The non-volatile memory has the advantage of retaining stored information even after power failure and is therefore extensively applied.

In general, a non-volatile memory having a silicon-oxide-nitride-oxide-semiconductor (SONOS) structure has the advantages of simple process and being readily combined with the peripheral circuit region or logic circuit region of an integrated circuit. However, with the decrease in size of the semiconductor device, replacing the planar memory structure with a 3D memory structure has become a trend. Therefore, how to provide a 3D SONOS memory structure having advantages such as high performance, simple process, and low production cost is an important issue.

SUMMARY OF THE INVENTION

The invention provides a semiconductor device combining a FinFET and a SONOS memory structure to form a 3D SONOS memory structure to improve the performance of the semiconductor device.

The invention provides a manufacturing method of a semiconductor device having a simple process and low cost to increase business competitiveness of the semiconductor device.

The invention provides a semiconductor device including a substrate, a plurality of isolation structures, a charge storage layer, and a conductive layer. The substrate has a memory region and a logic region. The substrate in the memory region has a plurality of semiconductor fins. The isolation structures are disposed in the substrate to isolate the semiconductor fins. The semiconductor fins are protruded beyond the isolation structures. The charge storage layer covers the semiconductor fins. The conductive layer is disposed across the semiconductor fins and the isolation structures such that the charge storage layer is disposed between the conductive layer and the semiconductor fins.

In an embodiment of the invention, a top surface of the isolation structures is lower than a top surface of the semiconductor fins, resulting in a height difference.

In an embodiment of the invention, the height difference is between 20 nm and 30 nm.

In an embodiment of the invention, a top surface of the substrate in the memory region and a top surface of the substrate in the logic region are coplanar.

In an embodiment of the invention, the charge storage layer includes stacked layers of oxide-nitride-oxide.

In an embodiment of the invention, the semiconductor device further includes a select gate structure disposed on the substrate in the logic region and across the substrate and the isolation structures.

In an embodiment of the invention, the conductive layer is a control gate.

In an embodiment of the invention, the semiconductor device further includes a doped region located in the substrate between the select gate structure and the control gate, wherein the select gate structure and the control gate share the doped region.

In an embodiment of the invention, a width of the semiconductor fins is between 5 nm and 20 nm.

The invention provides a manufacturing method of a semiconductor device including the following steps. A substrate including a memory region and a logic region is provided. A plurality of isolation structures is formed in the substrate in the memory region and the logic region. A pad oxide layer is formed on the substrate in the memory region and the logic region. The pad oxide layer in the memory region is removed to recess the isolation structures such that a plurality of portions of the substrate in the memory region is protruded beyond the isolation structures to form a plurality of semiconductor fins. A charge storage layer is formed to cover the semiconductor fins. A conductive layer disposed across the semiconductor fins and the isolation structures is formed such that the charge storage layer is disposed between the conductive layer and the semiconductor fins.

In an embodiment of the invention, the steps of removing the pad oxide layer in the memory region are as follows. A mask pattern is formed to cover the pad oxide layer in the logic region. A buffer oxide etching (BOE) process is performed for 5 seconds to 300 seconds to completely remove the pad oxide layer in the memory region and remove a portion of the isolation structures.

In an embodiment of the invention, an etch selectivity of the BOE process on the isolation structures and the substrate is between 100 and 5.

In an embodiment of the invention, the steps of removing the pad oxide layer in the memory region are as follows. A mask pattern is formed to cover the pad oxide layer in the logic region. An ion implantation process is performed on the pad oxide layer in the memory region. A BOE process is performed for 5 seconds to 300 seconds to completely remove the pad oxide layer in the memory region and remove a portion of the isolation structures.

In an embodiment of the invention, the ion implantation process includes implanting a dopant in the pad oxide layer in the memory region, and the dopant includes carbon, phosphorus, arsenic, or a combination thereof.

In an embodiment of the invention, after the pad oxide layer in the memory region is removed to recess the isolation structures, a top surface of the isolation structures is lower than a top surface of the semiconductor fins, resulting in a height difference.

In an embodiment of the invention, the height difference is between 20 nm and 30 nm.

In an embodiment of the invention, the manufacturing method of the semiconductor device further includes forming a select gate structure on the substrate in the logic region and across the substrate and the isolation structures.

In an embodiment of the invention, the conductive layer is a control gate.

In an embodiment of the invention, the manufacturing method of the semiconductor device further includes forming a doped region in the substrate between the select gate structure and the control gate after the select gate structure is forming, wherein the select gate structure and the control gate share the doped region.

In an embodiment of the invention, a width of the semiconductor fins is between 5 nm and 20 nm.

Based on the above, in the invention, in the step of removing the pad oxide layer in the memory region, a portion of the isolation structures is further removed to form a plurality of semiconductor fins. Next, a charge storage layer and a control gate are formed in order to cover the semiconductor fins to form a 3D SONOS memory structure, so that the performance of the semiconductor device is improved. Moreover, the process steps of the semiconductor device of the invention are simple and low-cost, and business competitiveness of the semiconductor device can be increased as a result.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A to FIG. 8A are cross sections of a manufacturing process of a semiconductor device shown along line A-A' of FIG. 1.

FIG. 2B to FIG. 8B are cross sections of a manufacturing process of a semiconductor device shown along line B-B' of FIG. 1.

DESCRIPTION OF THE EMBODIMENTS

The invention is more comprehensively described with reference to the figures of the present embodiments. However, the invention can also be implemented in various different forms, and is not limited to the embodiments in the present specification. The thicknesses of the layers and regions in the figures are enlarged for clarity. The same or similar reference numerals represent the same or similar devices and are not repeated in the following paragraphs.

Figure 1:
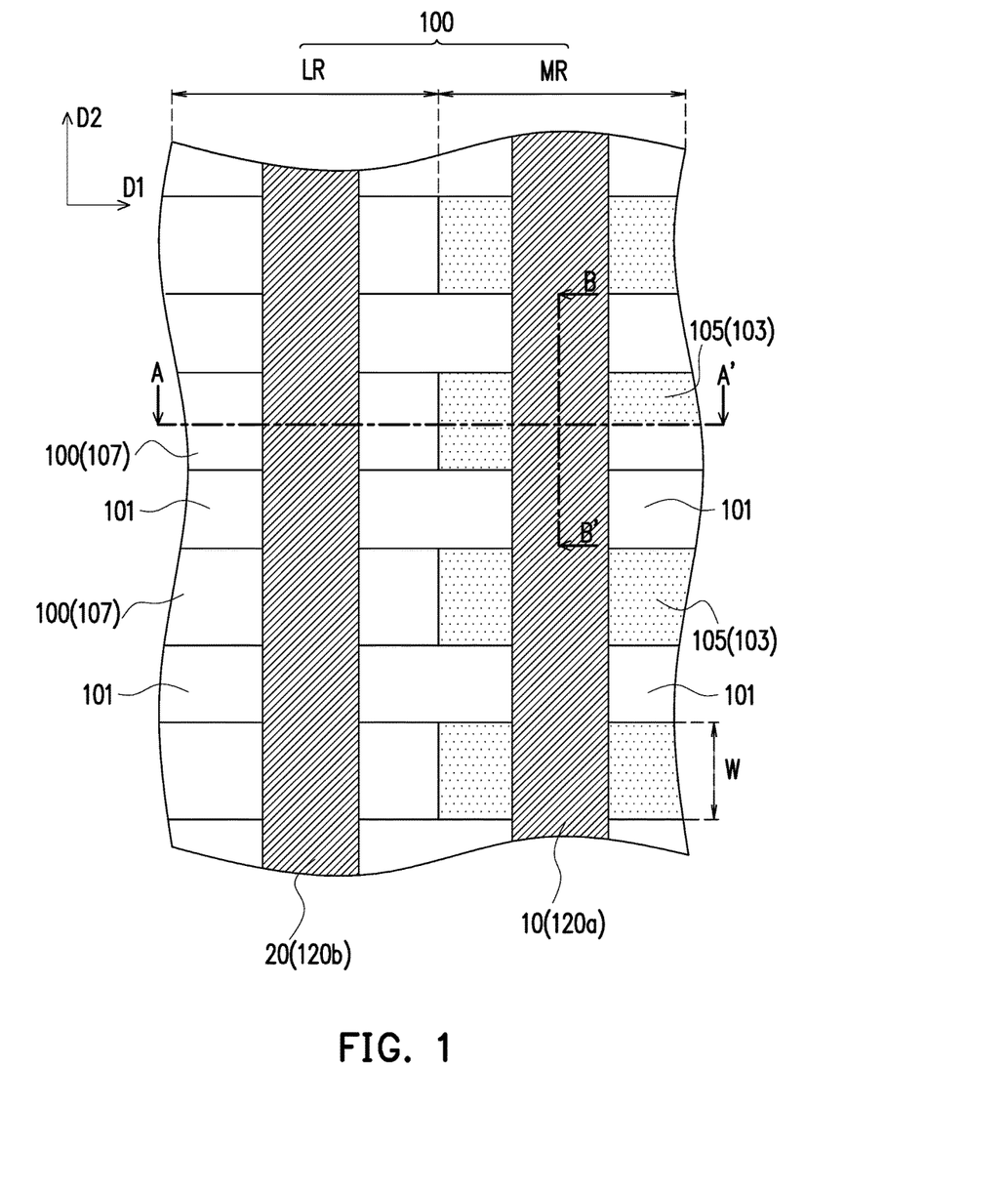
FIG. 1 is a plan view showing a semiconductor device according to an embodiment of the invention.

FIG. 1 is a plan view showing a semiconductor device according to an embodiment of the invention. In the present embodiment, the semiconductor device can be a semiconductor device having a SONOS memory structure, but the invention is not limited thereto.

Referring to FIG. 1, an embodiment of the invention provides a semiconductor device including a substrate 100, a plurality of isolation structures 101, a first gate stack 10, and a second gate stack 20. Specifically, the substrate 100 includes a memory region MR and a logic region LR. Although the memory region MR shown in FIG. 1 is located next to the logic region LR, the invention is not limited thereto. In other embodiments, the logic region LR can also surround the memory region MR. In other words, the configuration of the memory region MR and the logic region LR can be adjusted based on design requirement.

The isolation structures 101 are disposed in the substrate 100. Specifically, the isolation structures 101 are extended along a first direction D1 and disposed across the memory region MR and the logic region LR to divide the substrate 100 into a plurality of strip structures. As shown in FIG. 1, the strip structures and the isolation structures 101 are alternately arranged along a second direction D2. In an embodiment, the first direction D1 and the second direction D2 are perpendicular to each other.

Specifically, as shown in FIG. 1, the strip structures in the memory region MR can be semiconductor fins 105. In other words, the substrate 100 in the memory region MR has a plurality of semiconductor fins 105. The isolation structures 101 located in the substrate 100 isolate the semiconductor fins 105. The first gate stack 10 is disposed on the substrate 100 in the memory region MR and extended along the second direction D2 to cross and cover the isolation structures 101 and the semiconductor fins 105. The second gate stack 20 is disposed on the substrate 100 in the logic region LR and extended along the second direction D2 to cross and cover the isolation structures 101 and the substrate 100. In an embodiment, the first gate stack 10 can be a memory cell device and used as a control gate structure, and the second gate stack 20 can be a metal-oxide-semiconductor device and used as a select gate structure.

Figure 7A:
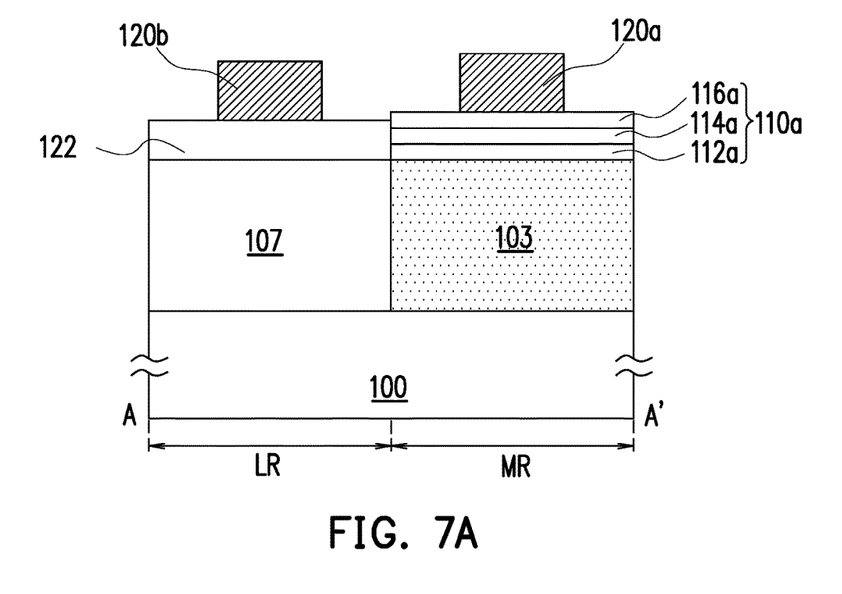
Figure 7B:
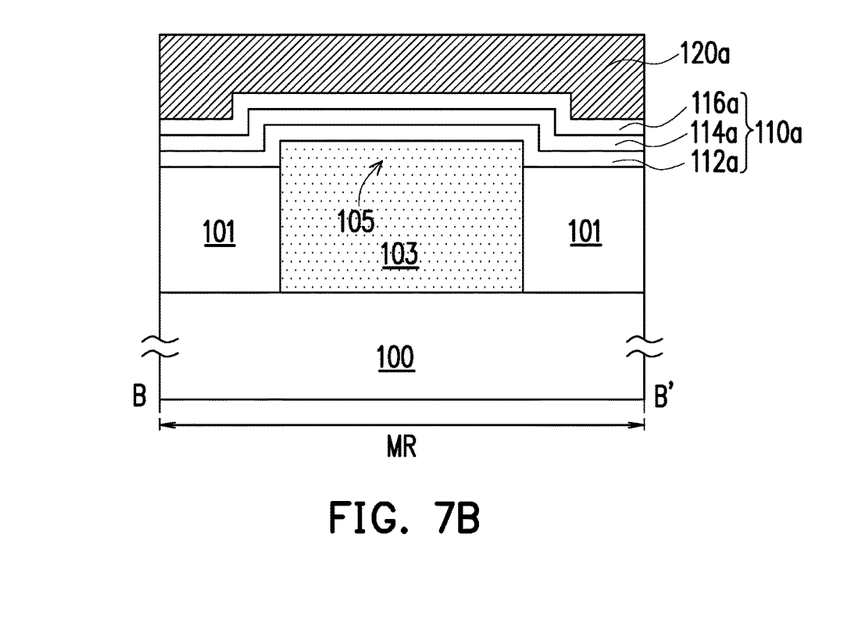
Figure 8A:
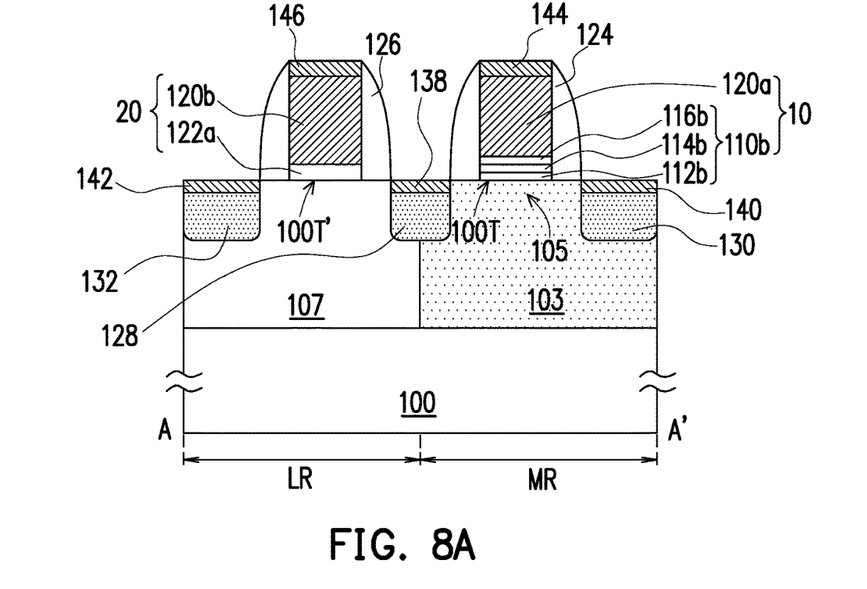
Figure 8B:
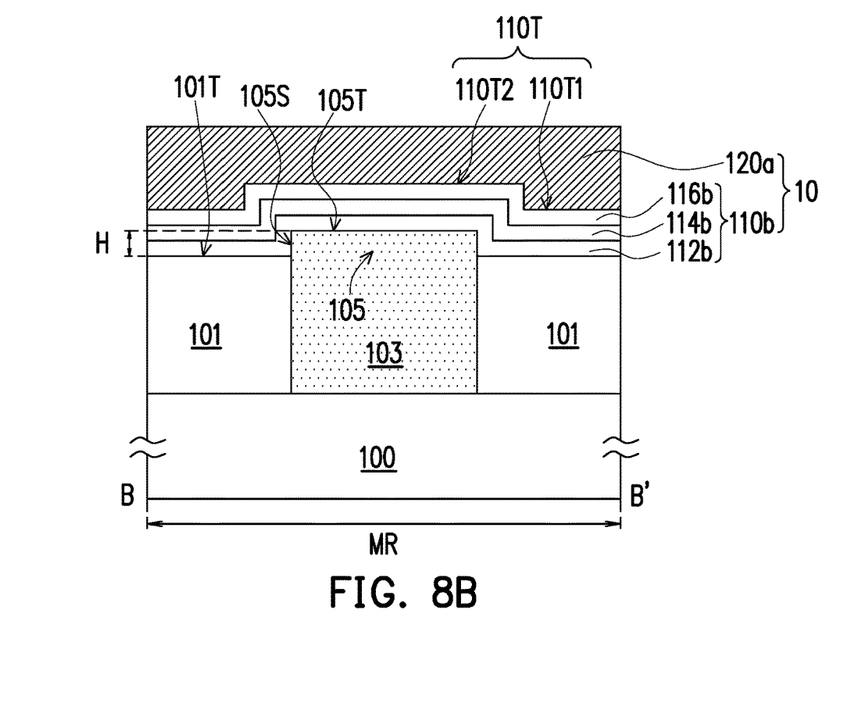
Figure 9:
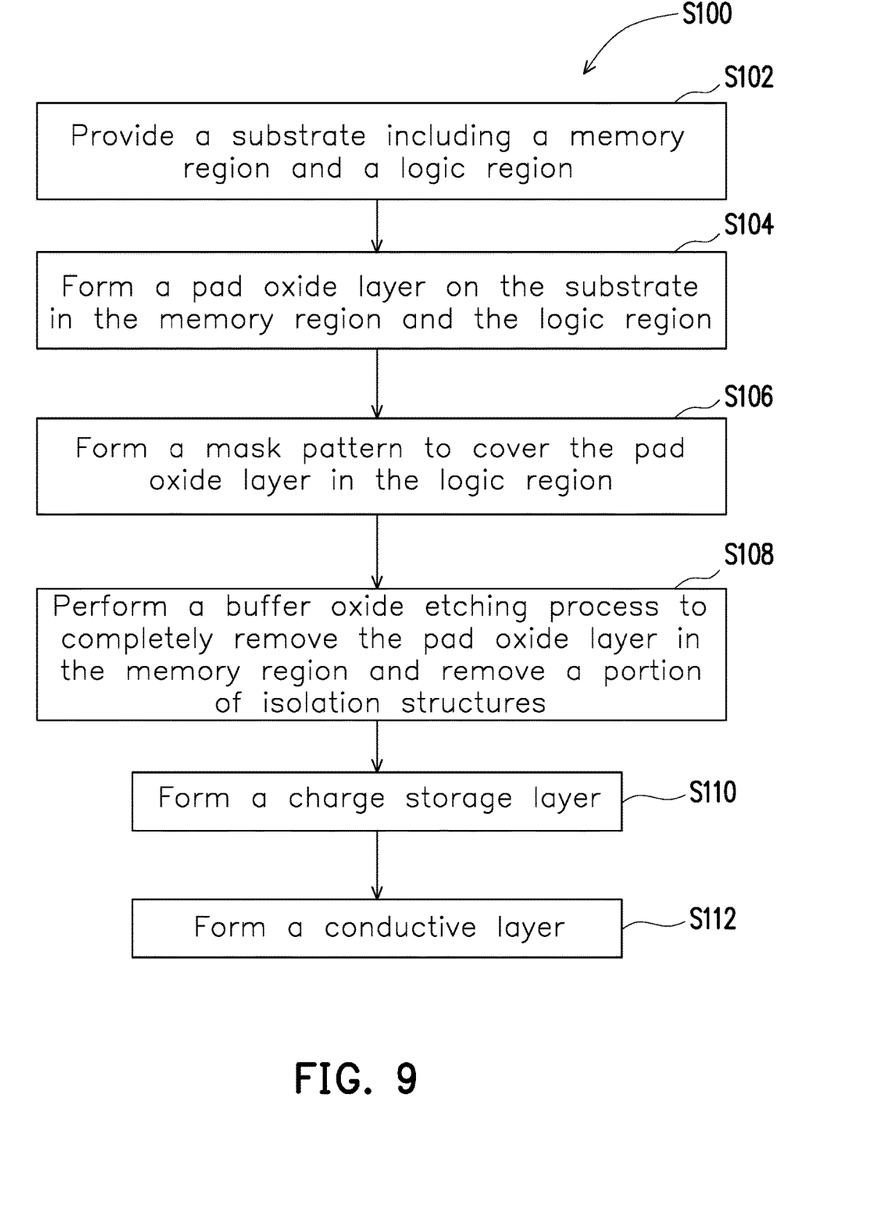
FIG. 9 shows a manufacturing process of a semiconductor device according to the first embodiment of the invention.

FIG. 2A to FIG. 8A are cross sections of a manufacturing process of a semiconductor device shown along line A-A' of FIG. 1. FIG. 2B to FIG. 8B are cross sections of a manufacturing process of a semiconductor device shown along line B-B' of FIG. 1. FIG. 9 shows a manufacturing process of a semiconductor device according to the first embodiment of the invention.

Figure 2A:
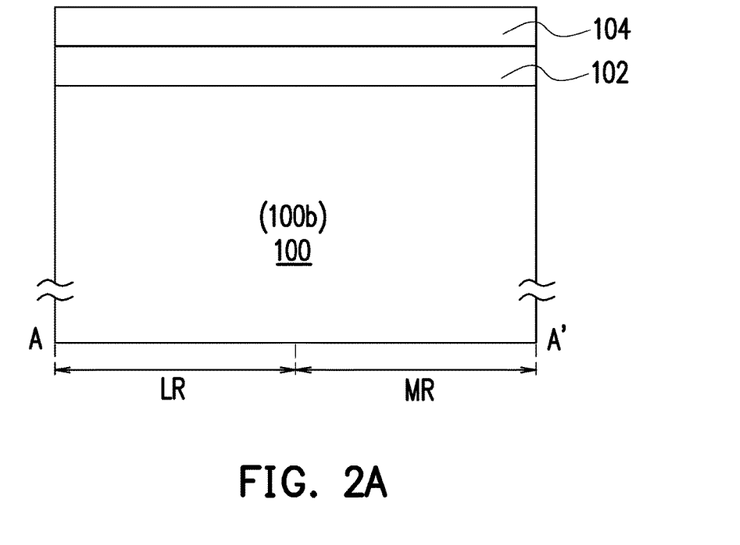
Figure 2B:
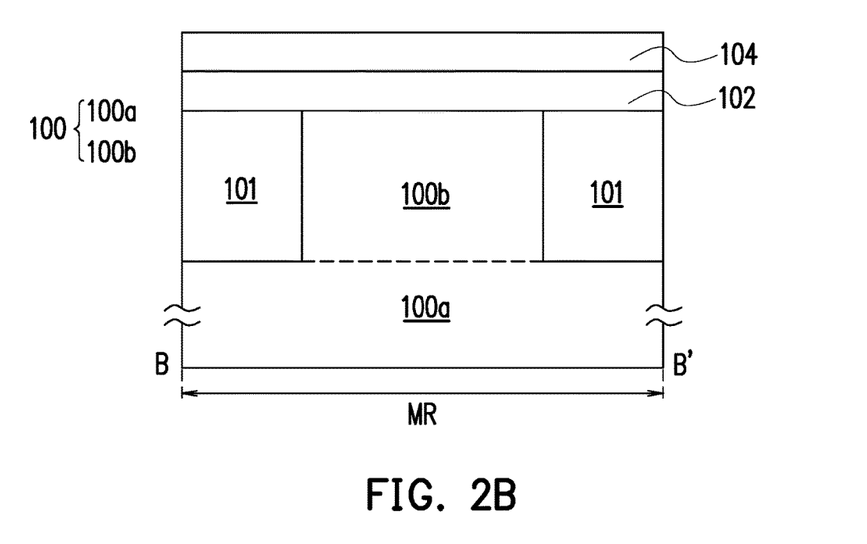

Referring to FIG. 2A, FIG. 2B, and FIG. 9, the first embodiment of the invention provides a manufacturing method S100 of a semiconductor device including the following steps. First, step S102 is performed to provide a substrate 100 including a memory region MR and a logic region LR adjacent to each other. In an embodiment, the substrate 100 includes a semiconductor substrate such as a silicon substrate.

Next, as shown in FIG. 2B, a plurality of isolation structures 101 is formed in the substrate 100. The isolation structures 101 are embedded in the substrate 100 such that the substrate 100 forms a comb structure. The comb structure includes a lower portion 100a and a plurality of comb portions 100b. The comb portions 100b are located on the lower portion 100a. The comb portions 100b are clamped between the isolation structures 101. In an embodiment, the isolation structures 101 can be, for instance, shallow trench isolation (STI) structures, and the material thereof includes an insulating material, and the insulating material can be silicon oxide, silicon nitride, or a combination thereof.

Next, step S104 is performed to form a pad oxide layer 102 and a nitride layer 104 on the substrate 100 in order. The pad oxide layer 102 blanketly covers the substrate 100 in the memory region MR and the logic region LR and the isolation structures 101. The nitride layer 104 covers the pad oxide layer 102 such that the pad oxide layer 102 is located between the nitride layer 104 and the substrate 100 and between the nitride layer 104 and the isolation structures 101. In an embodiment, the pad oxide layer 102 can be silicon oxide, and the forming method thereof includes, for instance, thermal oxidation or chemical vapor deposition (CVD). In an embodiment, the nitride layer 104 can be silicon nitride, and the forming method thereof includes CVD.

Figure 3A:
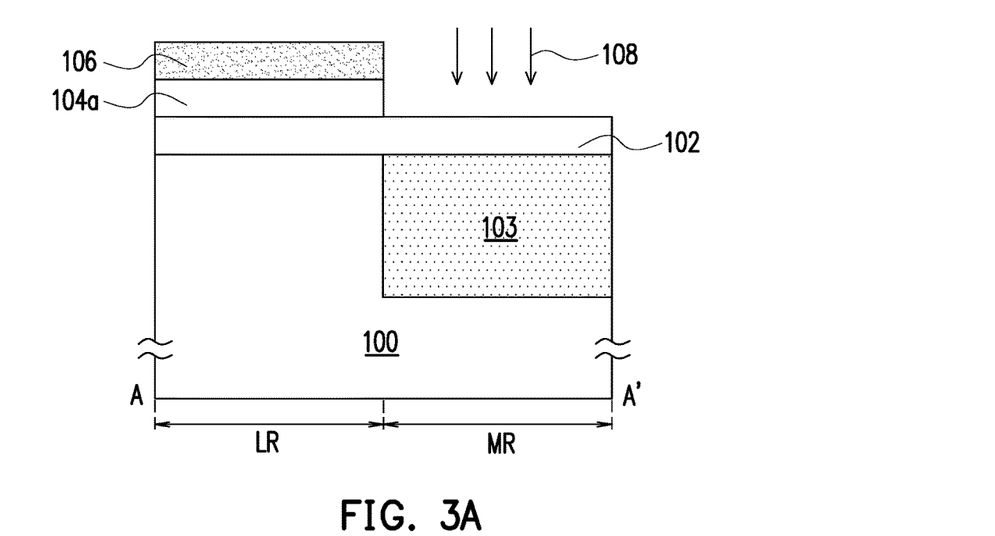

Next, step S106 is performed as shown in FIG. 2A, FIG. 2B, FIG. 3A, and FIG. 3B to form a mask pattern 106 on the nitride layer 104 in the logic region LR. Next, a patterning process is performed by using the mask pattern 106 as a mask to remove the nitride layer 104 in the memory region MR. In this case, as shown in FIG. 3A, the patterned nitride layer 104a and the mask pattern 106 thereon cover the top surface of the pad oxide layer 102 in the logic region LR and expose the top surface of the pad oxide layer 102 in the memory region MR. In an embodiment, the mask pattern 106 can be a photoresist formed by spin coating and lithography.

Figure 3B:
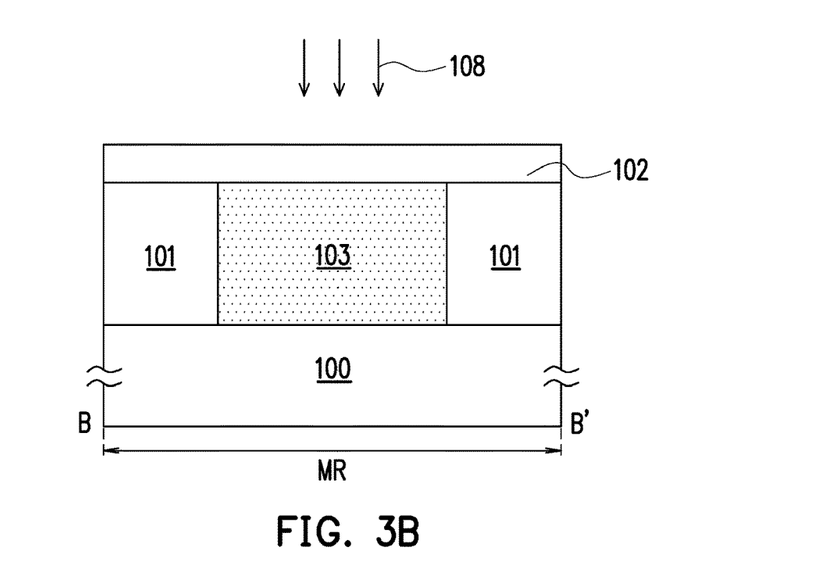

Next, an ion doping process 108 is performed on the substrate 100 in the memory region MR. In an embodiment, the ion doping process 108 includes at least two ion doping processes including a first ion doping process for forming a first well region 103 and a second ion doping process for adjusting the threshold voltage (Vt). In an embodiment, the dopant implanted in the first ion doping process can be, for instance, boron (B), and the dopant implanted in the second ion doping process can be, for instance, indium (In), and the doping concentrations of the two can be adjusted based on the requirements of different devices.

After the mask pattern 106 is removed, step S108 is performed as shown in FIG. 3A, FIG. 3B, FIG. 4A, and FIG. 4B to remove the pad oxide layer 102 in the memory region MR to recess the isolation structures 101, such that a plurality of portions of the substrate 100 in the memory region MR is protruded beyond the isolation structures 101 to form a plurality of semiconductor fins 105. Specifically, an etching process is performed by using the patterned nitride layer 104a as a mask to completely remove the pad oxide layer 102 in the memory region MR and remove a portion of the isolation structures 101. In an alternative embodiment, the mask pattern 106 can also be removed in the etching process.

In an embodiment, the etching process includes a wet etching process such as a buffer oxide etching (BOE) process. The BOE process includes etching by using an etchant formed by mixing HF, NH$_4$F, and water, and the ratio of the three can be adjusted based on actual need. In the present embodiment, the process time of the BOE process is between 5 seconds and 300 seconds. The etch selectivity of the BOE process for the isolation structures 101 and the substrate 100 is between 100 and 5. In other words, after the pad oxide layer 102 in the memory region MR is completely removed, the BOE process etches the isolation structures 101 and does not etch the substrate 100 or etches the substrate 100 in a small amount to form a fin-like structure. In this case, as shown in FIG. 4B, a top surface 101T of the isolation structures 101 is lower than a top surface 105T of the semiconductor fins 105 (or the substrate 100), resulting in a height difference H. In an embodiment, the height difference H is between 20 nm and 30 nm. In an embodiment, a width W of the semiconductor fins 105 is between 5 nm and 20 nm.

Figure 5A:
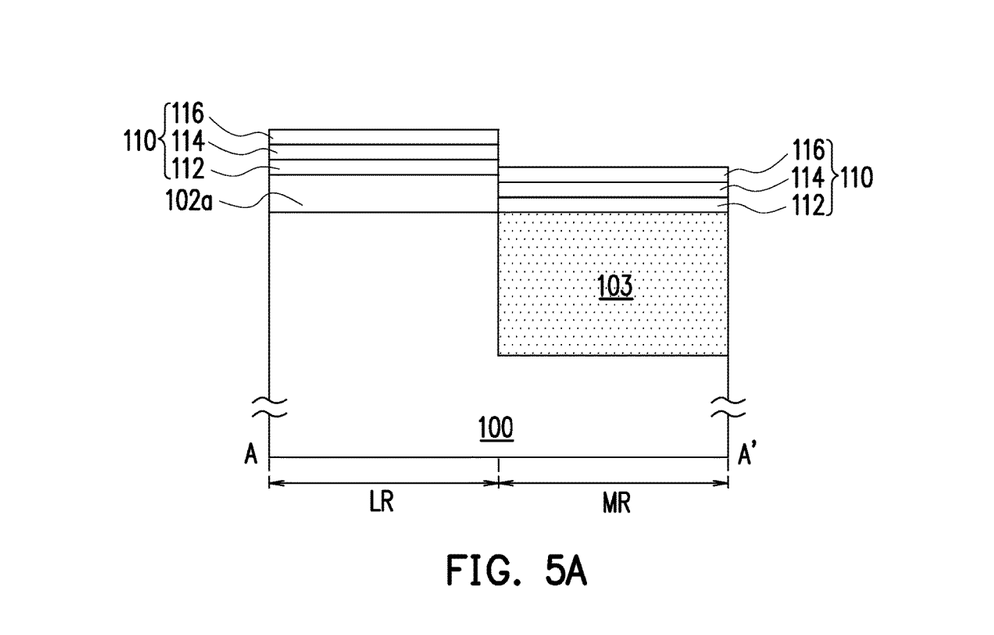
Figure 5B:
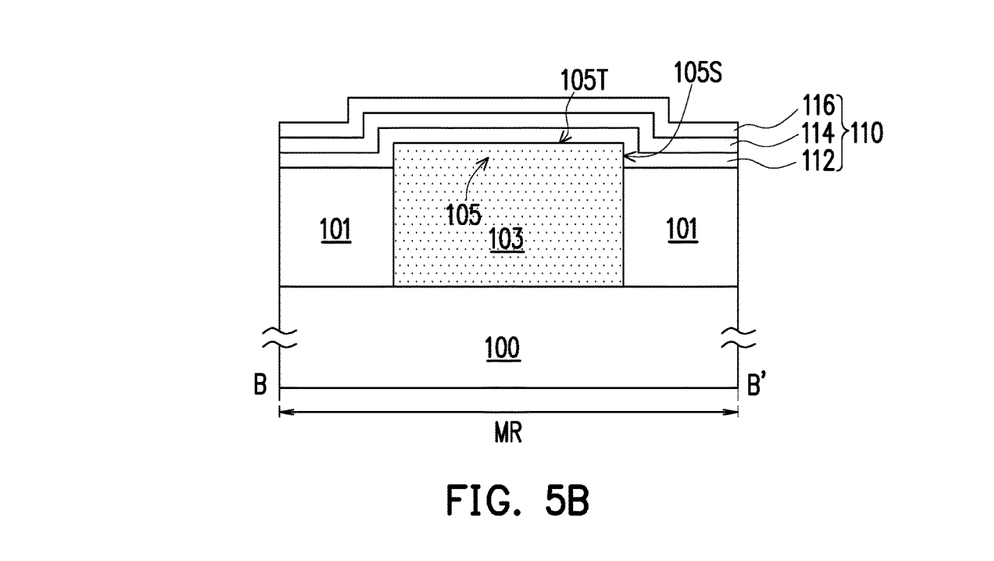
Figure 6A:
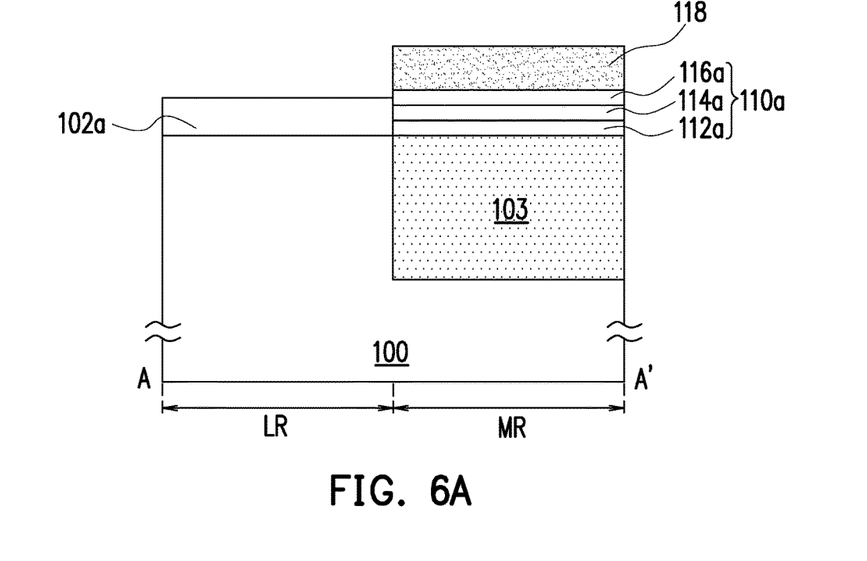
Figure 6B:
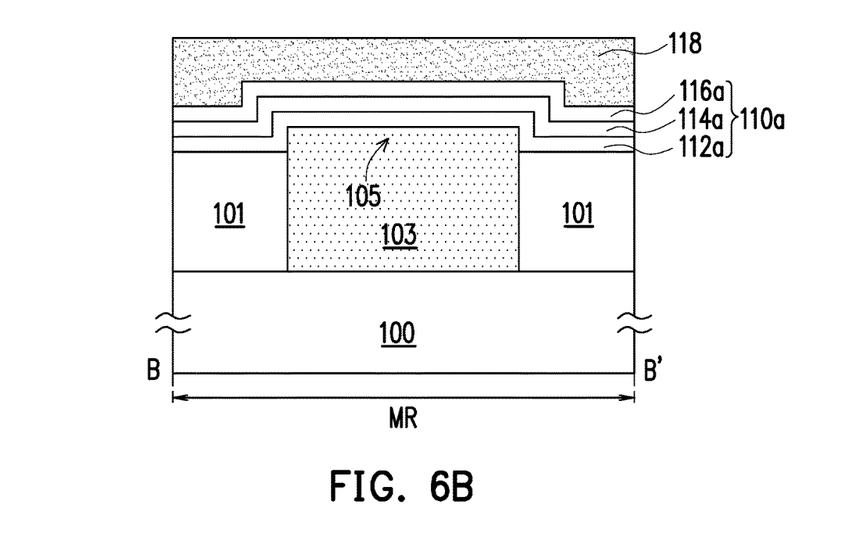

After the patterned nitride layer 104a is removed, step S110 is performed as shown in FIG. 5A and FIG. 5B to blanketly form a charge storage layer 110 on the substrate 100. It should be mentioned that, as shown in FIG. 5B, the charge storage layer 110 covers a top surface 105T and an upper sidewall 105S of the semiconductor fins 105. In other words, the charge storage layer 110 covers the surface of the semiconductor fins 105 exposed by (or protruded from) the isolation structures 101. In an embodiment, the charge storage layer 110 includes stacked layers of oxide-nitride-oxide (ONO). Specifically, the charge storage layer 110 includes a silicon oxide layer 112, a silicon nitride layer 114, and a silicon oxide layer 116, wherein the silicon nitride layer 114 is disposed between the two silicon oxide layers 112 and 116. However, the invention is not limited thereto, and in other embodiments, the charge storage layer 110 can also be, for instance, polysilicon (i.e., a floating gate) or stacked layers of ONON.

Referring to FIG. 5A, FIG. 5B, FIG. 6A, and FIG. 6B, a mask pattern 118 is formed on the charge storage layer 110 in the memory region MR. The mask pattern 118 covers the charge storage layer 110 in the memory region MR and exposes the charge storage layer 110 in the logic region LR. The charge storage layer 110 in the logic region LR is completely removed by using the mask pattern 118 as a mask to expose the top surface of the pad oxide layer 102a in the logic region LR. In an embodiment, the mask pattern 118 can be a photoresist formed by spin coating and lithography.

After the mask pattern 118 is removed, step S112 is performed as shown in FIG. 6A, FIG. 6B, FIG. 7A, and FIG. 7B to form conductive layers 120a and 120b disposed across the semiconductor fins 105 and the isolation structures 101. Specifically, a conductive material (not shown) can be first formed on the substrate 100. In an embodiment, the conductive material can be doped polysilicon, undoped polysilicon, or a combination thereof, and the forming method thereof includes CVD. Next, the conductive material is patterned to form a conductive layer 120a on the substrate 100 in the memory region MR and form a conductive layer 120b on the substrate 100 in the logic region LR. As shown in FIG. 7A and FIG. 7B, the conductive layer 120a is disposed on the charge storage layer 110a such that the charge storage layer 110a is disposed between the conductive layer 120a and the semiconductor fins 105. As shown in FIG. 1, the conductive layer 120a is a strip structure extended along the second direction D2 and crossing the isolation structures 101 and the semiconductor fins 105. In an embodiment, the conductive layer 120a is used as a control gate.

Moreover, before the conductive layer 120b is formed, the pad oxide layer 102 in the logic region LR is removed, a second well region 107 is formed in the substrate 100, and a gate dielectric layer 122 is formed on the substrate 100. In an embodiment, the second well region 107 can have P-type conductivity, and the dopant implanted therein can be, for instance, boron (B). In an embodiment, the gate dielectric layer 122 can be silicon oxide, and the forming method thereof includes thermal oxidation or CVD. Next, a conductive layer 120b is formed on the gate dielectric layer 122. As shown in FIG. 1, the conductive layer 120b is also a strip structure extended along the second direction D2 and crossing the isolation structures 101 and the substrate 100 (or the second well region 107). In an embodiment, the conductive layer 120b is used as a select gate.

Referring to FIG. 7A, FIG. 7B, FIG. 8A, and FIG. 8B, after the conductive layers 120a and 120b are formed, the gate dielectric layer 122 and the charge storage layer 110a are patterned to respectively form a first gate stack 10 and a second gate stack 20. Specifically, a portion of the charge storage layer 110a is removed by using the conductive layer 120a as a mask to expose the top surface of the substrate 100 (or the first well region 103). Moreover, a portion of the gate dielectric layer 122 is removed by using the conductive layer 120b as a mask to expose the top surface of the substrate 100 (or the second well region 107). It can be known from FIG. 8A that, a top surface 100T of the substrate 100 in the memory region MR and a top surface 100T' of the substrate 100 in the logic region LR are coplanar.

The first gate stack 10 includes a charge storage layer 110b and a conductive layer 120a. The charge storage layer 110a conformally covers the surface of the semiconductor fins 105. As shown in FIG. 8B, the charge storage layer 110 covers a top surface 105T and an upper sidewall 105S of the semiconductor fins 105, such that the top surface 110T of the charge storage layer 110b is an uneven surface. Specifically, a top surface 100T1 of the charge storage layer 110b located on the isolation structures 101 is lower than a top surface 100T2 of the charge storage layer 110b located on the semiconductor fins 105.

It should be mentioned that, in the present embodiment, since the top surface 110T of the charge storage layer 110b is an uneven surface, the contact area between the charge storage layer 110b and the conductive layer 120a is increased, such that the gate control capacity of the semiconductor device is increased. As a result, in the present embodiment, the on-current (Ion) of the semiconductor device in erase state can be effectively increased without increasing off-current (Ioff). In other words, the overall performance of the semiconductor device of the present embodiment can be effectively increased.

Moreover, the second gate stack 20 includes a gate dielectric layer 122a and a conductive layer 120b located on the gate dielectric layer 122a. As shown in FIG. 1, the second gate stack 20 can be a strip structure extended along the second direction D2 to cross and cover the isolation structures 101 and the substrate 100 (or the second well region 107).

After the first gate stack 10 and the second gate stack 20 are formed, the manufacturing method of the semiconductor device of the present embodiment further includes forming spacers 124 and 126. Specifically, the spacer 124 covers the sidewall of the first gate stack 10 and the spacer 126 covers the sidewall of the second gate stack 20. In an embodiment, the spacers 124 and 126 can include a single-layer structure, a bi-layer structure, or a multilayer structure. The material of the spacers 124 and 126 includes an insulating material, such as silicon oxide, silicon nitride, silicon oxynitride, or a combination thereof. The forming method of the spacers 124 and 126 is known to those skilled in the art and is not repeated herein.

After the spacers 124 and 126 are formed, the manufacturing method of the semiconductor device of the present embodiment further includes forming doped regions 128, 130, and 132 in the substrate 100. Specifically, the doped region 128 is disposed in the substrate 100 between the first gate stack 10 and the second gate stack 20. In an embodiment, the doped region 128 can have N-type conductivity, and the dopant implanted therein can be, for instance, phosphorous (P) or arsenic (As). As shown in FIG. 8A, the doped region 128 can be the source region of the first gate stack 10 (or control gate structure) and be the drain region of the second gate stack 20 (or select gate structure) at the same time. In other words, the first gate stack 10 and the second gate stack 20 share the doped region 128 to electrically connect the first gate stack 10 and the second gate stack 20 in series. In an alternate embodiment, the doped region 128 also includes a lightly-doped drain (LDD).

In an embodiment, the doped region 130 is disposed in the substrate 100 at another side of the first gate stack 10 (i.e., the side away from the doped region 128). The doped region 130 can have N-type conductivity, and the dopant implanted therein can be, for instance, phosphorous (P) or arsenic (As). As shown in FIG. 8A, the doped region 130 can be the drain region of the first gate stack 10 (or control gate structure). In an alternate embodiment, the doped region 130 also includes a lightly-doped drain (LDD).

In an embodiment, the doped region 132 is disposed in the substrate 100 at another side of the second gate stack 20 (i.e., the side away from the doped region 128). The doped region 132 can have N-type conductivity, and the dopant implanted therein can be, for instance, phosphorous (P) or arsenic (As). As shown in FIG. 8A, the doped region 132 can be the source region of the second gate stack 20 (or select gate structure). In an alternate embodiment, the doped region 132 also includes a lightly-doped drain (LDD).

After the doped regions 128, 130, and 132 are formed, the manufacturing method of the semiconductor device of the present embodiment further includes forming metal silicide layers 138, 140, 142, 144, and 146. Specifically, the metal silicide layer 138 is formed on the doped region 128. The metal silicide layer 140 is formed on the doped region 130. The metal silicide layer 142 is formed on the doped region 132. The metal silicide layer 144 is formed on the conductive layer 120a (i.e., control gate). The metal silicide layer 146 is formed on the conductive layer 120b (i.e., select gate). In an embodiment, the material of the metal silicide layers 138, 140, 142, 144, and 146 is, for instance, nickel silicide (NiSi), cobalt silicide (CoSi), titanium silicide (TiSi), tungsten silicide (WSi), molybdenum silicide (MoSi), platinum silicide (PtSi), palladium silicide (PdSi), or a combination thereof. The forming method of the metal silicide layers 138, 140, 142, 144, and 146 is known to those skilled in the art and is not repeated herein.

Figure 10:
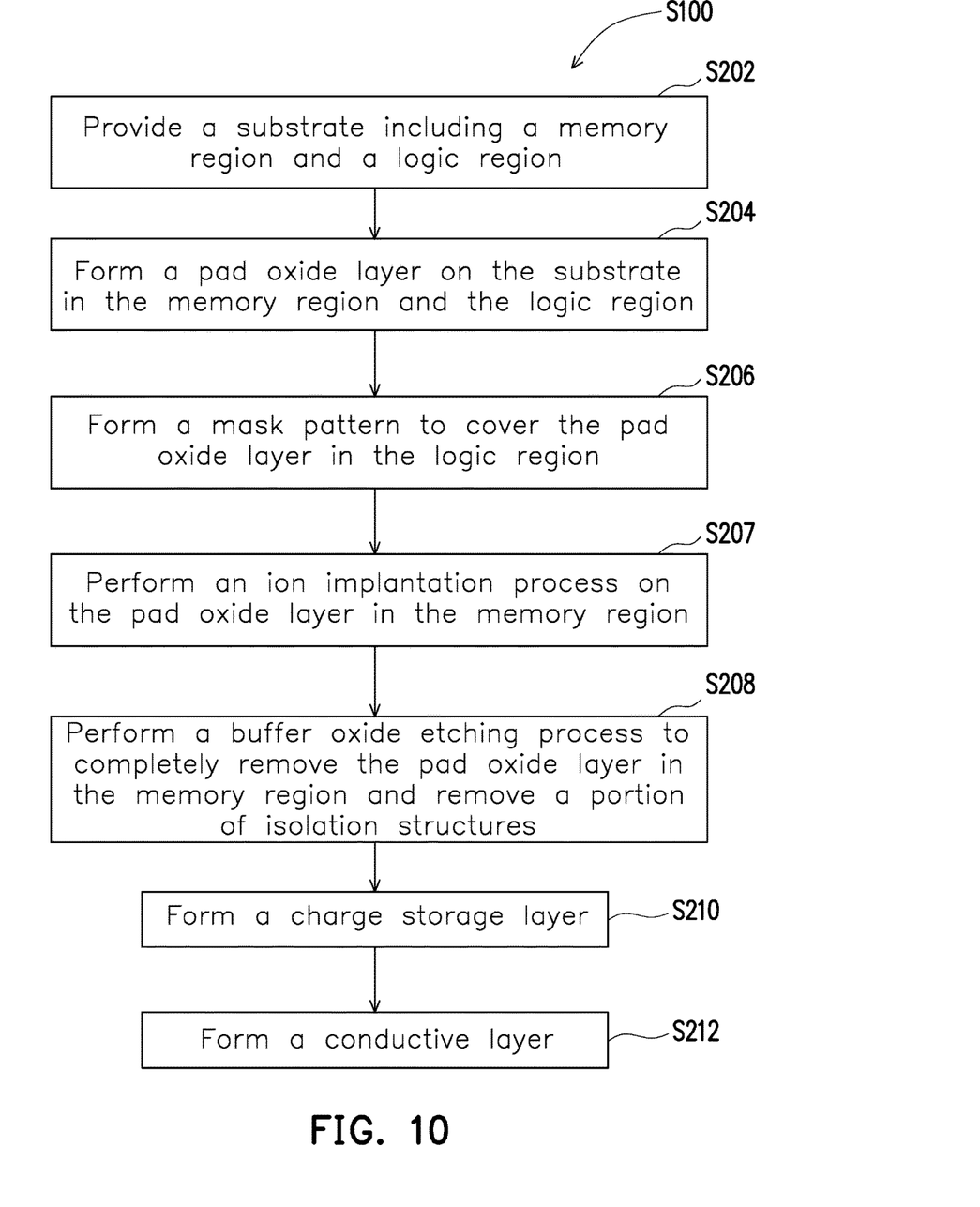
FIG. 10 shows a manufacturing process of a semiconductor device according to the second embodiment of the invention.

FIG. 10 shows a manufacturing process of a semiconductor device according to the second embodiment of the invention.

Referring to FIG. 9 and FIG. 10, basically, a manufacturing method S200 of the semiconductor device of the second embodiment of the invention is similar to the manufacturing method S100 of the semiconductor device of the first embodiment of the invention. In other words, steps S202, S204, and S206 are the same as steps S102, S104, and S106 and are not repeated herein. The difference between the two is that, after step S206 is performed, the manufacturing method S200 of the semiconductor device of the second embodiment further includes performing step S207, i.e., performing an ion implantation process on the pad oxide layer 102 in the memory region MR as shown in FIG. 3A and FIG. 3B. Specifically, after the ion doping process 108 (including a first ion doping process for forming the first well region 103 and a second ion doping process for adjusting the threshold voltage) is performed on the substrate 100 in the memory region MR, an ion implantation process is performed on the pad oxide layer 102 in the memory region MR. It should be mentioned that, the ion implantation process can be used to change the structural composition of the pad oxide layer 102 in the memory region MR, such that the implanted pad oxide layer 102 is more readily removed in a subsequent BOE process, so as to reduce the process time of the BOE process. In other words, the BOE process time of step S208 can be less than the BOE process time of step S108. In an embodiment, the dopant implanted in the ion implantation process includes carbon, phosphorous, arsenic, or a combination thereof.

Figure 4A:
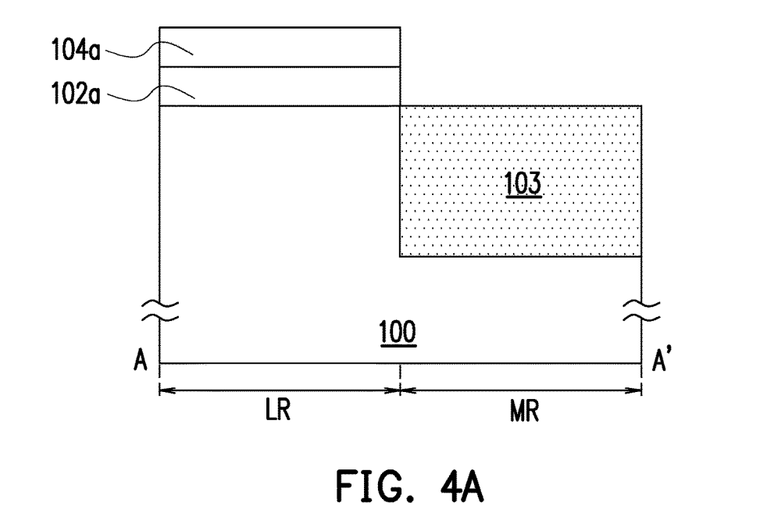
Figure 4B:
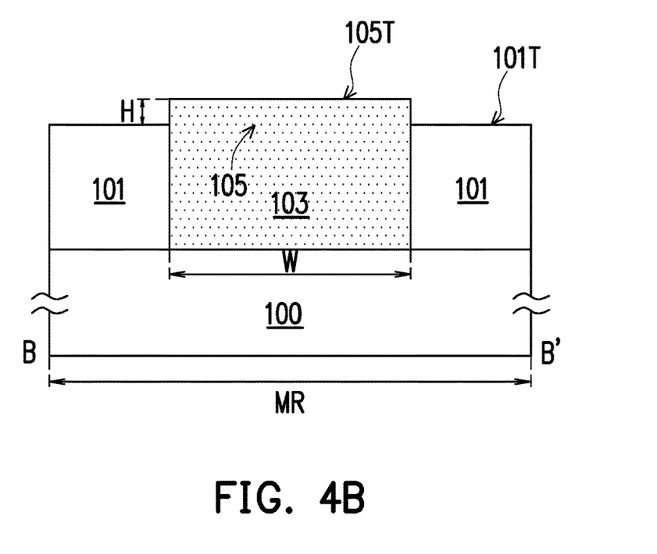

Next, step S208 is performed as shown in FIG. 4A and FIG. 4B to perform an etching process by using the patterned nitride layer 104a as a mask to completely remove the pad oxide layer 102 in the memory region MR and remove a portion of the isolation structures 101. In an embodiment, the etching process includes a wet etching process such as a buffer oxide etching (BOE) process. In the present embodiment, the process time of the BOE process is between 5 seconds and 300 seconds. The etch selectivity of the BOE process for the isolation structures 101 and the substrate 100 is between 100 and 5. In other words, after the pad oxide layer 102 in the memory region MR is completely removed, the BOE process etches the isolation structures 101 and does not etch the substrate 100 or etches the substrate 100 in a small amount to form a fin-like structure.

Next, steps S210 and S212 are performed to form the charge storage layer 110 and form the conductive layers 120a and 120b. Steps S210 and S212 are the same as steps S110 and S112 and are therefore not repeated herein.

Based on the above, in the invention, in the step of removing the pad oxide layer in the memory region, a portion of the isolation structures is further removed to form a plurality of semiconductor fins. Next, a charge storage layer and a control gate are formed in order to cover the semiconductor fins to form a 3D SONOS memory structure, so that the performance of the semiconductor device is improved. Moreover, the process steps of the semiconductor device of the invention are simple and low-cost, and business competitiveness of the semiconductor device can be increased as a result.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor device, comprising:
a substrate having a memory region and a logic region, wherein the substrate in the memory region has a plurality of semiconductor fins;
a plurality of isolation structures disposed in the substrate to isolate the semiconductor fins, wherein the semiconductor fins are protruded beyond the isolation structures;
a charge storage layer covering the semiconductor fins;
a control gate disposed across the semiconductor fins and the isolation structures, such that the charge storage layer is disposed between the control gate and the semiconductor fins;
a select gate structure disposed on the substrate in the logic region and across the substrate and the isolation structures; and
a doped region located in the substrate between the select gate structure and the control gate, wherein the select gate structure and the control gate share the doped region.

2. The semiconductor device of claim 1, wherein a top surface of the isolation structures is lower than a top surface of the semiconductor fins by a height difference.

3. The semiconductor device of claim 2, wherein the height difference is between 20 nm and 30 nm.

4. The semiconductor device of claim 1, wherein a top surface of the substrate in the memory region and a top surface of the substrate in the logic region are coplanar.

5. The semiconductor device of claim 1, wherein the charge storage layer comprises stacked layers of oxide-nitride-oxide.

6. The semiconductor device of claim 1, wherein a width of the semiconductor fins is between 5 nm and 20 nm.

7. A manufacturing method of a semiconductor device, comprising:
providing a substrate comprising a memory region and a logic region;
forming a plurality of isolation structures in the substrate in the memory region and the logic region;
forming a pad oxide layer on the substrate in the memory region and the logic region;
removing the pad oxide layer in the memory region to recess the isolation structures, such that a plurality of portions of the substrate in the memory region is protruded beyond the isolation structures to form a plurality of semiconductor fins;
forming a charge storage layer to cover the semiconductor fins; and
forming a control gate disposed across the semiconductor fins and the isolation structures, such that the charge storage layer is disposed between the control gate and the semiconductor fins;
forming a select gate structure on the substrate in the logic region and across the substrate and the isolation structures; and
forming a doped region in the substrate between the select gate structure and the control gate after the select gate structure is formed, wherein the select gate structure and the control gate share the doped region.

8. The manufacturing method of the semiconductor device of claim 7, wherein the step of removing the pad oxide layer in the memory region comprises:
forming a mask pattern to cover the pad oxide layer in the logic region;
performing a buffer oxide etching process for 5 seconds to 300 seconds to completely remove the pad oxide layer in the memory region and remove a portion of the isolation structures.

9. The manufacturing method of the semiconductor device of claim 8, wherein an etch selectivity of the buffer oxide etching process on the isolation structures and the substrate is between 100 and 5.

10. The manufacturing method of the semiconductor device of claim 7, wherein the step of removing the pad oxide layer in the memory region comprises:
forming a mask pattern to cover the pad oxide layer in the logic region;
performing an ion implantation process on the pad oxide layer in the memory region; and
performing a buffer oxide etching process for 5 seconds to 300 seconds to completely remove the pad oxide layer in the memory region and remove a portion of the isolation structures.

11. The manufacturing method of the semiconductor device of claim 10, wherein the ion implantation process comprises implanting a dopant in the pad oxide layer in the memory region, and the dopant comprises carbon, phosphorus, arsenic, or a combination thereof.

12. The manufacturing method of the semiconductor device of claim 7, wherein after the pad oxide layer in the memory region is removed to recess the isolation structures, a top surface of the isolation structures is lower than a top surface of the semiconductor fins by a height difference.

13. The manufacturing method of the semiconductor device of claim 12, wherein the height difference is between 20 nm and 30 nm.

14. The manufacturing method of the semiconductor device of claim 7, wherein a width of the semiconductor fins is between 5 nm and 20 nm.

\* \* \* \* \*